United States Patent [19]

Chatterjee et al.

[11] Patent Number: 5,900,274
[45] Date of Patent: May 4, 1999

[54] CONTROLLED COMPOSITION AND CRYSTALLOGRAPHIC CHANGES IN FORMING FUNCTIONALLY GRADIENT PIEZOELECTRIC TRANSDUCERS

[75] Inventors: Dilip K. Chatterjee; Syamal K. Ghosh, both of Rochester; Edward P. Furlani, Lancaster, all of N.Y.

[73] Assignee: Eastman Kodak Company, Rochester, N.Y.

[21] Appl. No.: 09/071,485

[22] Filed: May 1, 1998

[51] Int. Cl.⁶ ........................................................ B05D 5/12
[52] U.S. Cl. ................................................ 427/100; 29/25.35
[58] Field of Search ................................ 427/100, 126.2, 427/419.3; 29/25.35

[56] References Cited

U.S. PATENT DOCUMENTS

| | | | |
|---|---|---|---|
| 5,233,256 | 8/1993 | Hayashi et al. | 310/317 |
| 5,302,935 | 4/1994 | Chatterjee . | |
| 5,336,282 | 8/1994 | Ghosh et al. . | |
| 5,358,913 | 10/1994 | Chatterjee et al. . | |
| 5,674,794 | 10/1997 | Chatterjee et al. . | |
| 5,677,072 | 10/1997 | Chatterjee et al. . | |

FOREIGN PATENT DOCUMENTS 239187 of 1992 Japan .
336708 of 1992 Japan .

*Primary Examiner*—Brian K. Talbot
*Attorney, Agent, or Firm*—Raymond L. Owens

[57] ABSTRACT

A method of forming a piezoelectric element which includes piezoelectric material having a variable functionally gradient d-coefficient comprising coating a block having a uniform concentration of piezoelectric material by the steps of applying a first layer having piezoelectric material with a different chemical composition than the block onto a surface of the block to provide a different crystallographic structure than the block; and sequentially applying one or more layers of piezoelectric material on the first layer and subsequent layers with different chemical compositions of piezoelectric material also having different crystallographic structures than the block and the subsequently applied layers so as to form the piezoelectric element which has a functionally gradient d-coefficient.

3 Claims, 4 Drawing Sheets

CONTROLLED COMPOSITION AND CRYSTALLOGRAPHIC CHANGES IN FORMING FUNCTIONALLY GRADIENT PIEZOELECTRIC TRANSDUCERS

CROSS REFERENCE TO RELATED APPLICATION

Reference is made to commonly assigned U.S. patent application Ser. No. 09/071,486, filed May 1, 1998, still pending, entitled "Functionally Gradient Piezoelectric Transducers" by Furlani et al the disclosure of which is incorporated herein by reference.

FIELD OF THE INVENTION

The invention relates generally to the field of piezoelectric transducers, and in particular to a method for fabricating piezoelectric elements that have functionally gradient piezoelectric properties.

BACKGROUND OF THE INVENTION

Piezoelectric transducers are used in a broad range of devices including accelerometers, microphones, resonators, voltage generators, ultrasonic welding and cleaning devices, and microstepping and micropumping devices. Conventional piezoelectric transducers comprise one or more uniformly polarized piezoelectric elements with attached surface electrodes. The three most common transducer configurations are multilayer ceramic, monomorph or bimorphs, and flextensional composite transducers. To activate a transducer, a voltage is applied across its electrodes thereby creating an electric field throughout the piezoelectric elements. This field induces a change in the geometry of the piezoelectric elements resulting in elongation, contraction, shear or combinations thereof. The induced geometric distortion of the elements can be used to implement motion or perform work. However, a drawback of conventional piezoelectric transducers is that two or more bonded piezoelectric elements are often needed to implement a desired geometric distortion such as bending. Moreover, when multiple bonded elements are used, stress induced in the elements due to their constrained motion can damage or fracture an element due to abrupt changes in material properties and strain at material interfaces.

SUMMARY OF THE INVENTION

It is an object of the present invention to provide an improved method of making a piezoelectric element of functionally gradient piezoelectric materials.

The present invention, is directed to solving the above object and solving the problems noted above.

This object is achieved in a A method of forming a piezoelectric element which includes piezoelectric material having a variable functionally gradient d-coefficient comprising coating a block having a uniform concentration of piezoelectric material by the steps of:

(a) applying a first layer having piezoelectric material with a different chemical composition than the block onto a surface of the block to provide a different crystallographic structure than the block; and (b) sequentially applying one or more layers of piezoelectric material on the first layer and subsequent layers with different chemical compositions of piezoelectric material also having different crystallographic structures than the block and the subsequently applied layers so as to form the piezoelectric element which has a functionally gradient d-coefficient.

These and other aspects, objects, features, and advantages of the present invention will be more clearly understood and appreciated from a review of the following detailed description of the preferred embodiments and appended claims, and by reference to the accompanying drawings.

Specifically, the functionally gradient material of the present invention can be used to fabricate a piezoelectric bending transducer with a single piezoelectric element as compared to the multiple piezoelectric elements that are used in the prior art bimorph transducers.

The present piezoelectric transducers have the following advantages:

1. They enable the use of a single piezoelectric element to implement a desired geometric distortion thereby eliminating the need for multilayered or composite piezoelectric structures;

2. They eliminate the need for multiple electrodes and associated drive electronics; and 3. They minimize or eliminate stress induced fracturing that occurs in multilayered or composite piezoelectric structures.

BRIEF DESCRIPTION OF THE DRAWINGS

To facilitate understanding, identical reference numerals have been used, where possible, to designate identical elements that are common to the figures.

DETAILED DESCRIPTION OF THE PREFERRED EMBODIMENT

Figure 1A:
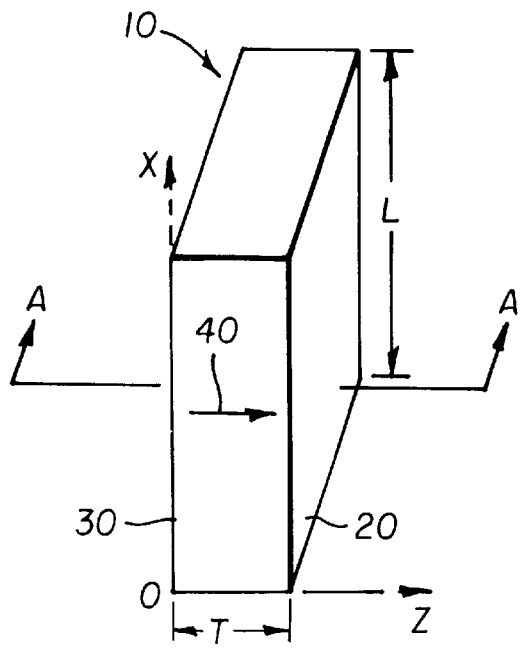
FIG. 1A illustrates a perspective view of a piezoelectric element of the present invention.
Figure 1B:
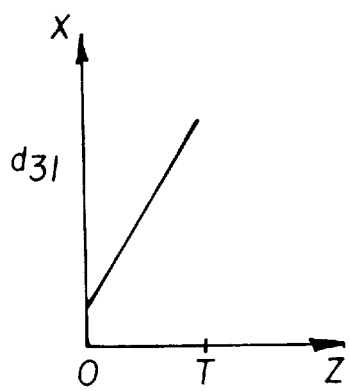
FIGS. 1B and 1C are graphs which depict the functional dependence of the piezoelectric $d_{31}$ coefficient of a piezoelectric element of the present invention, and the functional dependence of the piezoelectric $d_{31}$ coefficient of the prior art piezoelectric transducer element, respectively.
Figure 1C:
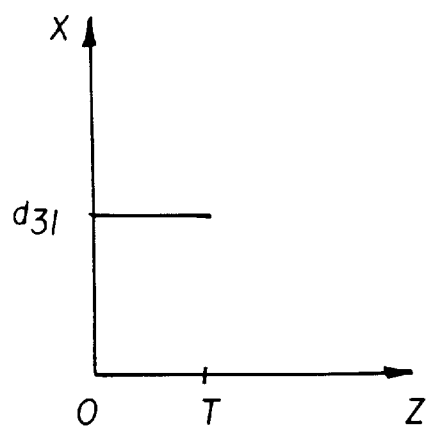

Referring to FIG. 1A, a perspective is shown of a piezoelectric element 10 of the present invention. The piezoelectric element 10 has first and second surfaces 20 and 30, respectively. The width of the piezoelectric element 10 is denoted by T and runs perpendicular to the first and second surfaces 20 and 30, respectively, as shown. The length of the piezoelectric element 10 is denoted by L and runs parallel to the first and second surfaces 20 and 30, respectively, as shown. The piezoelectric element 10 is poled perpendicularly to the first and second surfaces 20 and 30 as indicated by polarization vector 40. In conventional piezoelectric transducers the piezoelectric "d"-coefficients are constant throughout the piezoelectric element. Moreover, the magnitude of the induced sheer and strain are related to these "d"-coefficients via the constitutive relation as is well known. The piezoelectric element 10 is fabricated in a novel manner so that its piezoelectric properties vary in a prescribed fashion across its width as described below. The $d_{31}$ coefficient varies along a first direction perpendicular to the first surface 20 and the second surface 30, and decreases from the first surface 20 to the second surface 30, as shown in FIG. 1B. This is in contrast to the uniform or constant spatial dependency of the $d_{31}$ coefficient in conventional prior art piezoelectric elements as shown in FIG. 1C.

Figure 2A:
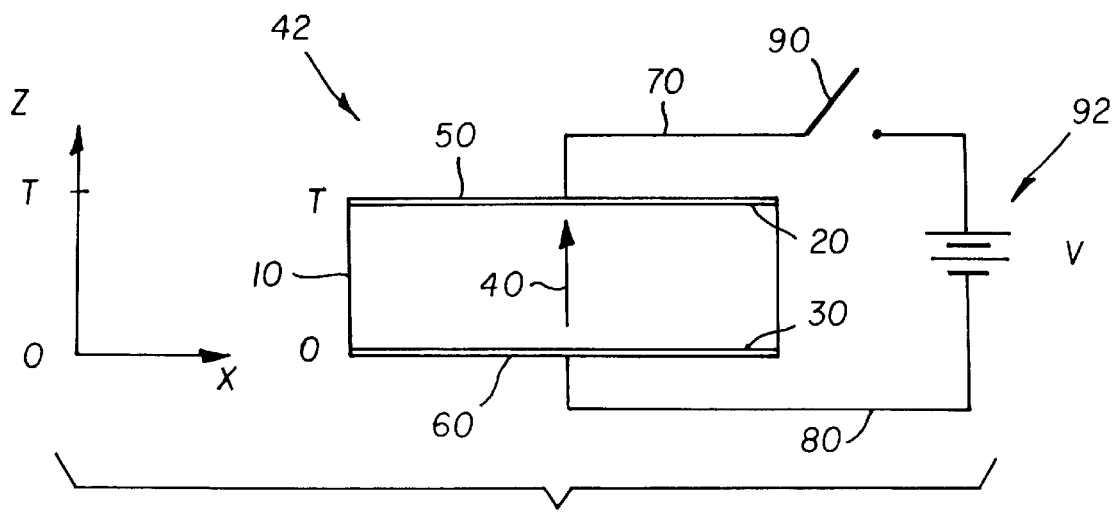
FIGS. 2A and 2B illustrate cross-sectional views of a piezoelectric transducer with the piezoelectric element of FIG. 1A, the taken along lines A—A of FIG. 1A, before and after transducer activation, respectively.
Figure 2B:
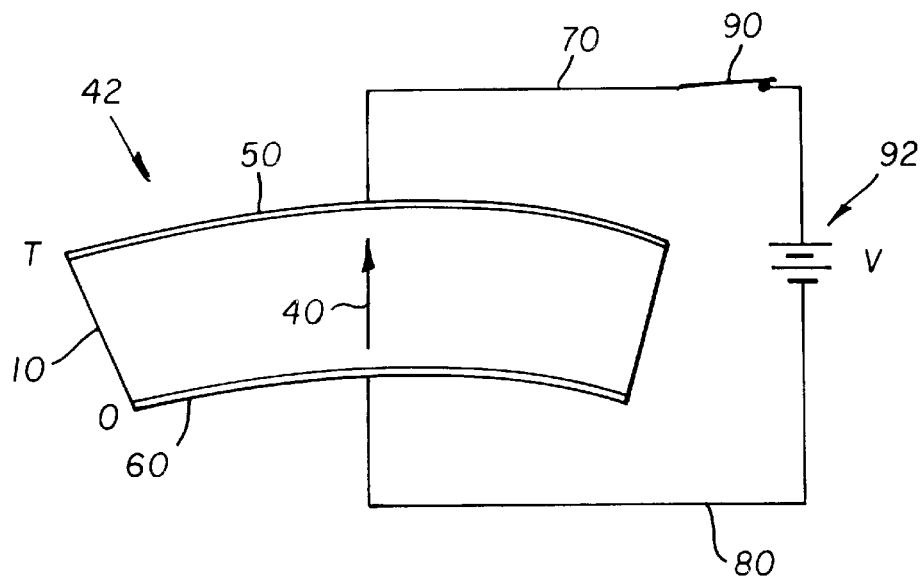

Referring now to FIGS. 2A and 2B, cross-sectional views are shown of a piezoelectric transducer 42 comprising the piezoelectric element 10 of FIG. 1A, taken along line A—A of FIG. 1A before and after activation, respectively. The piezoelectric transducer 42 comprises piezoelectric element 10, with polarization vector 40, and first and second surface electrodes 50 and 60 respectively attached to first and second surfaces 20 and 30, respectively. The first and second surface electrodes 50 and 60, respectively, are connected to wires 70 and 80, respectively. The wire 70 is connected to a switch 90 which in turn is connected to a first terminal of voltage source 92. The wire 80 is connected to the second terminal of voltage source 92 as shown. In FIG. 2A, the transducer 42 is shown with switch 90 open. Thus there is no voltage across the transducer 42 and it remains unactivated. In FIG. 2B, the transducer 42 is shown with switch 90 closed. In this case, the voltage V of voltage source 92 is impressed across the transducer 42 thereby creating an electric field through the piezoelectric element 10 causing it to expand in length parallel to its first and second surfaces 20 and 30, respectively and perpendicular to polarization vector 40 as is well known. Specifically we define S(z) to be the expansion in the x (parallel or lateral) direction noting that this expansion varies as a function of z. The thickness of the piezoelectric element is given by T as shown, and therefore $S(z)=(d_{31}(z) V/T) \times L$ as is well known. The functional dependence of the piezoelectric coefficient $d_{31}(z)$ increases with z as shown in FIG. 1B. Thus the lateral expansion S(z) of the piezoelectric element 10 decreases in magnitude from the first surface 20 to the second surface 30. For a more detailed see the cross-referenced commonly assigned U.S. patent application to Furlani et al. Thus, the parallel or lateral expansion of piezoelectric element 10 will increase with z as shown in FIG. 4B thereby causing a bending of the piezoelectric element 10. It is important to note that this piezoelectric transducer 42 requires only one piezoelectric element as compared to two or more elements for the prior art bimorph structures.

The novel materials used in the type of device described in this invention are functionally gradient piezoelectric materials. The novelty of such material and the present invention that led to manufacture of such material are described below. The most common base materials used for such devices as described in this invention are ceramic materials, particularly oxides with non-centrosymmetric structures. This suggests that the crystal structures of these materials are not cubic or more particularly, do not possess simple symmetry. The crystal structures of these materials are predominately fall into two classes: tetragonal and rhombohedral.

The materials which can be selected to have the crystal structures as described above and possess piezoelectric properties are lead titanate zirconate (PZT), lanthanum doped lead titanate zirconate (PLZT), lithium niobate ($LiNbO_3$), lithium tantalate ($LiTaO_3$), potassium niobate ($KNbO_3$), barium titanate ($BaTiO_3$) and such. All these piezoelectric materials form multi-component systems.

Continuous changes in material composition, and crystallographic structure, in a multi-component system result in gradients in physical and mechanical properties. These types of material systems is termed as functionally gradient materials (FGMs). FGMs are essentially a special class of composite materials having microscopically in homogeneous character. Continuous changes in microstructures distinguish FGMs from the conventional composite materials, in this particular case the conventional piezoelectric materials. Usually, the inorganic materials, more particularly, the ceramics, the alloys, and the metals are the materials of choice that are combined in a controlled manner either to optimize a specific property or to establish a specific profile of a property variation across the article. The novelty of this feature and its induction in the piezoelectric materials to manufacture a novel actuator constitute the main theme of this invention.

One advantage of designing and manufacturing functionally gradient piezoelectric materials is that the "d" coefficient of these materials can be tailor made to suite a specific application. A continuous variation of "d" coefficients in a structure is advantageous because it can exert desired amount of stress and strain in specific areas of the structure, reducing the fatigue of the material and also reducing the power requirements to drive those structures. The fatigue in the piezoelectric materials, particularly in the transducers made from such materials leads to premature fracture of the materials and catastrophic failure of the transducers.

In a specific example, lead titanate zirconate, which has a general formula as $Pb(Ti_{1-x}Zr_x)O_3$, is usually designated as PZT. In this general formula x is an integer. This is one of the commonly used piezoelectric materials. Among various crystallographic phases of PZT material the tetragonal and the rhombohedral phases are polar-piezoelectric. Most of the useful piezoelectric properties in this material are achieved at composition around x=0.52, where both the tetragonal and the rhombodral crystallographic phases coexist. The piezoelectric properties of PZT can be enhanced in this transition region, for the range of z between about 0.54 and 0.50, where both rhombohedral and tetragonal crystallographic forms coexist. This transition also has similar effects on the Curie transition in enhancing some aspect of piezoelectric behavior. Normally, PZT materials are prepared by mixing and ball milling of lead titanate, $PbTiO_3$ and lead zirconate, $PbZrO_3$ powders and then hot pressing the powder compacts. Functionally gradient PST material can be obtained by sequential dip coating and/or sequential slip casting.

Figure 3A:
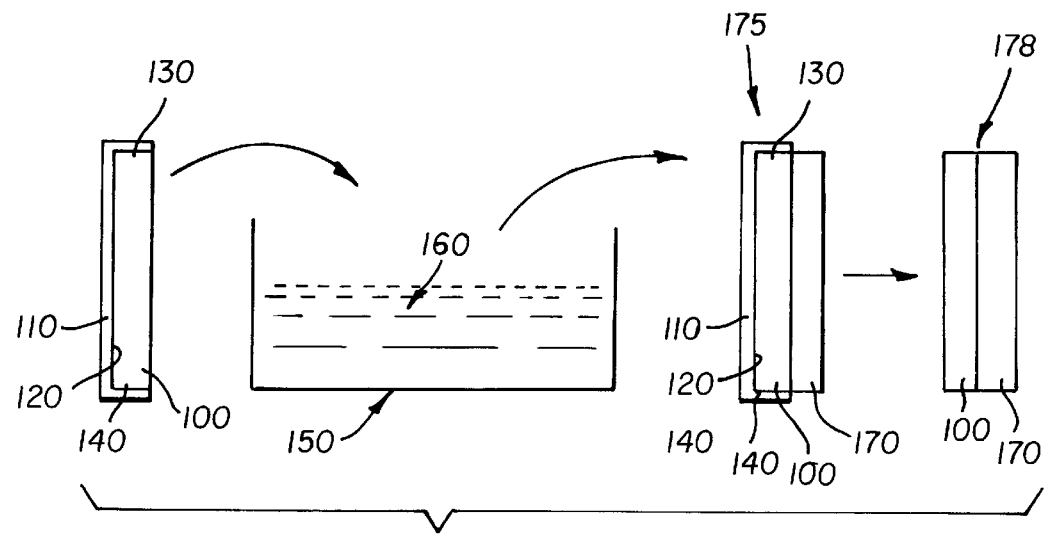
FIGS. 3A, 3B, and 3C illustrate various steps in the method of manufacturing functionally gradient piezoelectric element respectively.

Referring to FIG. 3A in the method of manufacturing a functionally gradient piezoelement of PZT, a thin block 100 of a standard commercially available PZT material was coated with photoresist layer 110 on the one side 120 of the block. The PZT material block has a uniform concentration of piezoelectric material across its length and width. The coating of the block with photoresist was done to mask the surface. The photoresist was coated on the block in such a manner that the top and bottom ends 130, 140 of the block were also masked. Now the photoresist-coated block was dipped in a bath 150 containing aqueous slurry 160 of lead titanate and lead zirconate, the chemical composition or proportion of these ingredients is different than that of which comprises the chemical composition or proportion in the block 100. The block 100 was then removed from the bath 150 and dried at about 130° C. in an oven. This treatment causes formation of a layer 170 comprised of ingredients of the PZT material having a different chemical composition that in the block 100. The photoresist layer 110 was stripped off composite block 175 by either heating at high temperature or by plasma treatment known in the art. The composite block 178 was then further coated with photoresist layer 180 to block off the unexposed side 120 of the original block 100. The photoresist was coated in such a manner that it covers the top and bottom ends 190, 200 of the composite block 178 and the ends were masked.

Figure 3B:
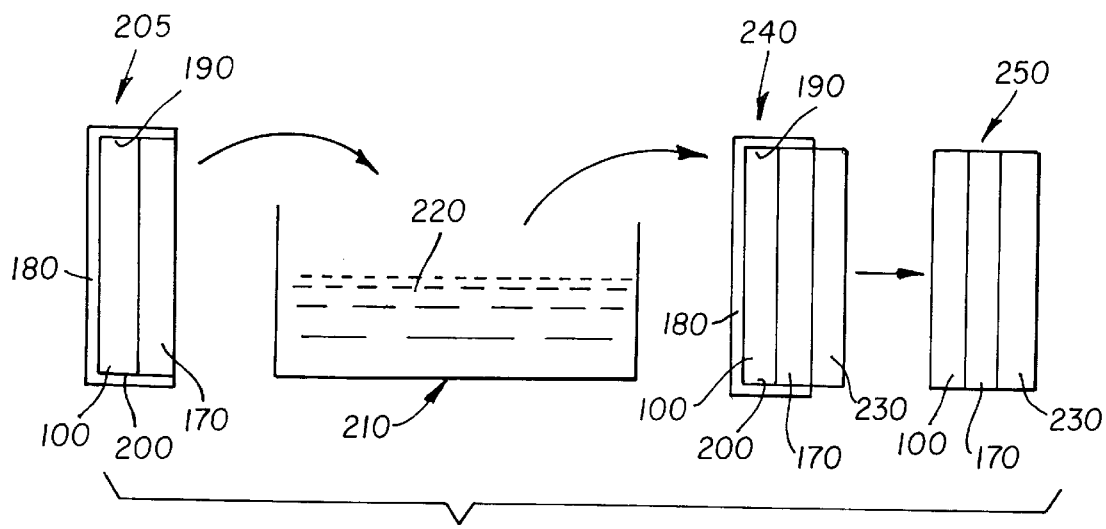

Referring now to FIG. 3B, the photoresist-coated composite block 205 was dip coated in a bath 210 having an aqueous slurry 220 of different chemical composition or proportion of lead titanate and lead zirconate than that in the previous bath 150. This produces an additional layer 230 on the new photoresist-coated composite block 240. The drying of the newly formed layer 230 and stripping of the photoresist layer 180 were performed following the procedures described above to produce a composite block 250. The block 250 comprised of three discrete layers 100, 170, and 230 of piezoelectric material of different chemical compositions having varying ratios of titanium to zirconium.

Figure 3C:
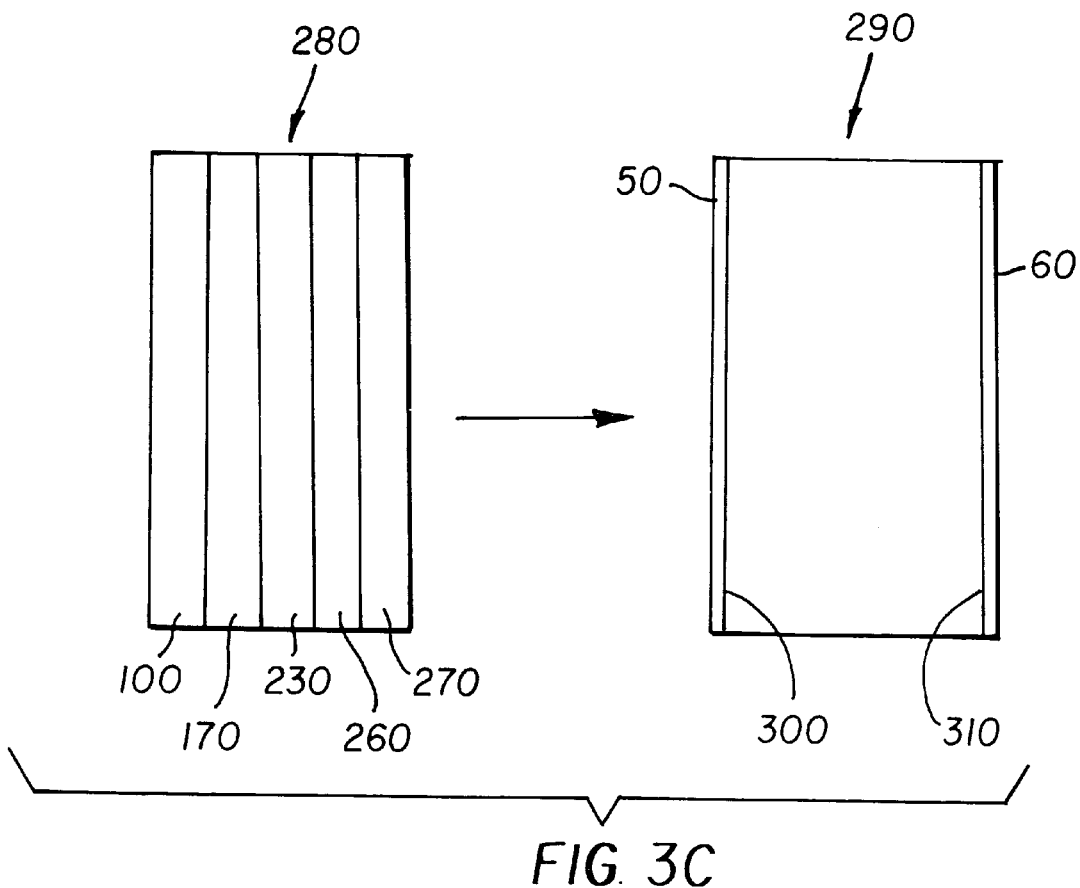

The procedure described above can be repeated a number of times to build up multiple layers of discrete piezo materials on a block. One such block 280 is shown in FIG. 3C which comprises five discrete layers 100, 170, 230, 260, and 270.

The block 280 was then sintered in a furnace in the range of at about 900° to 1300° C. and preferably at about 1100° C. for densification and more importantly effecting the composition gradient in the block. The sintering at high temperatures of the composite materials with layers having discrete compositions allows diffusion of atomic species. This causes a smooth variation of composition gradient across the material. After sintering the composite block 280 it transformed to a functionally gradient piezoelectric block 290 in which the composition and also the ratios of titanium to zirconium gradually and linearly varied in the direction of width, that is from a first surface 300 to a second surface 310.

As discussed earlier, the functionally gradient materials can be made either by effecting a change in composition, or by change in crystal structure. The foregoing embodiment of the method of manufacture of the functionally gradient piezomaterial both compositional and crystallographic changes were effected.

The functionally piezoelectric material block 290 was then coated with electrode materials such as silver, gold, copper, gold-palladium alloy, silver-nickel alloy and such metals and alloys known in the art. The coating was done on the surfaces 300, 310 thereby creating surface electrodes 50 and 60, respectively. The coating can be done by physical vapor deposition, such as sputtering, thermal evaporation, and electron beam evaporation. The spin coating of metallo-organic precursor of the electrode materials on the FGM piezomaterial and decomposing it at high temperatures is also a preferred method of forming electrodes. The electrodes on the functionally gradient piezoelectric materials can also be constructed by screen-printing (see commonly-assigned U.S. Pat. No. 5,302,935 to Chatterjee et al) of conductive thick film inks made of gold, silver, copper, palladium, and their alloys.

Once the functionally gradient piezoelectric material 290 has been formed, it is poled to align its ferroelectric domains as is well-known. Such poling can be accomplished by applying an external electric field or by applying an electric field through surface electrodes 50 and 60.

Figure 4:
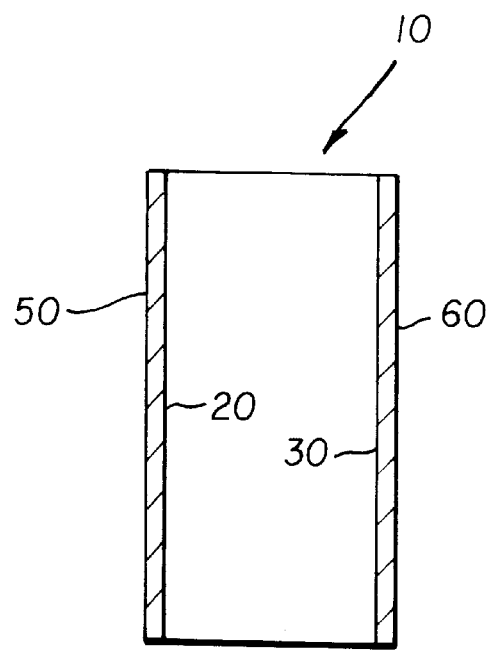
FIG. 4 shows a functionally gradient piezoelectric material with electrodes.

FIG. 4 shows a piezoelectric element 10 such as PZT with functionally gradient "d"-coefficients. The piezoelectric element 10 has first and second surfaces 20 and 30, respectively with respective first and second surface electrodes 50 and 60, as shown. This functionally gradient piezoelectric element was subsequently used as a novel actuator as described earlier.

The invention has been described with reference to a preferred embodiment, however, it will be appreciated that variations and modifications can be effected by a person of ordinary skill in the art without departing from the scope of the invention.

PARTS LIST
10 piezoelectric element
20 first surface
30 second surface
40 polarization vector
42 piezoelectric transducer
50 first surface electrode
60 second surface electrode
70 wire
80 wire
90 switch
92 voltage source
100 thin block or wafer
110 photoresist layer
120 unexposed side of block
130 top end of block
140 bottom end of the block
150 bath containing slurry
160 aqueous slurry
170 material layer
175 composite block with photoresist
178 composite block without photoresist
180 photoresist layer
190 top end of block
200 bottom end of block 178
205 photoresist coated composite block
210 bath containing slurry
220 aqueous slurry
230 material layer
240 photoresist coated composite block
Parts List cont'd
250 composite block
260 material layer
270 material layer
280 block with discrete material layers
290 functionally gradient piezoelectric block
300 first surface of block
310 second surface of block

What is claimed is:

1. A method of forming a piezoelectric element having first and second parallel surfaces which include piezoelectric material having a variable functionally gradient $d_{31}$-coefficient comprising coating a block having a uniform concentration of piezoelectric material by the steps of:

(a) applying a first layer having piezoelectric material with a first chemical composition on a flat surface of the block to provide a different crystallographic structure than the block, by dip coating the first layer from a bath containing an aqueous slurry of piezoelectric material of the first chemical composition;

(b) sequentially applying one or more layers of piezoelectric material, by dip coating one or more subsequent layers from baths, each containing an aqueous slurry of piezoelectric material of different second chemical compositions of piezoelectric material on the first layer and subsequent layers with the second chemical composition of piezoelectric material also having different crystallographic structures than the block and the subsequently applied layers so as to form the piezoelectric element which has a functionally gradient $d_{31}$-coefficient; and (c) poling the piezoelectric element in a direction perpendicular to the first and second parallel surfaces such that it will change geometry in response to the applied electric field so that the piezoelectric element is poled in the direction perpendicular to the first and second parallel surfaces and an applied electric field will cause different elongations in the block and subsequently applied layers.

2. The method of claim 1 wherein poling is accomplished by applying an electric field throughout the piezoelectric element.

3. The method of claim 1 wherein the crystallographic structure of each layer is either tetragonal or rhombohedral.

* * * * *